Nov. 28, 1972 R. R. RUSSO 3,704,208
PROCESS FOR FORMING A CONDUCTIVE COATING ON A SUBSTRATE
Filed April 21, 1970
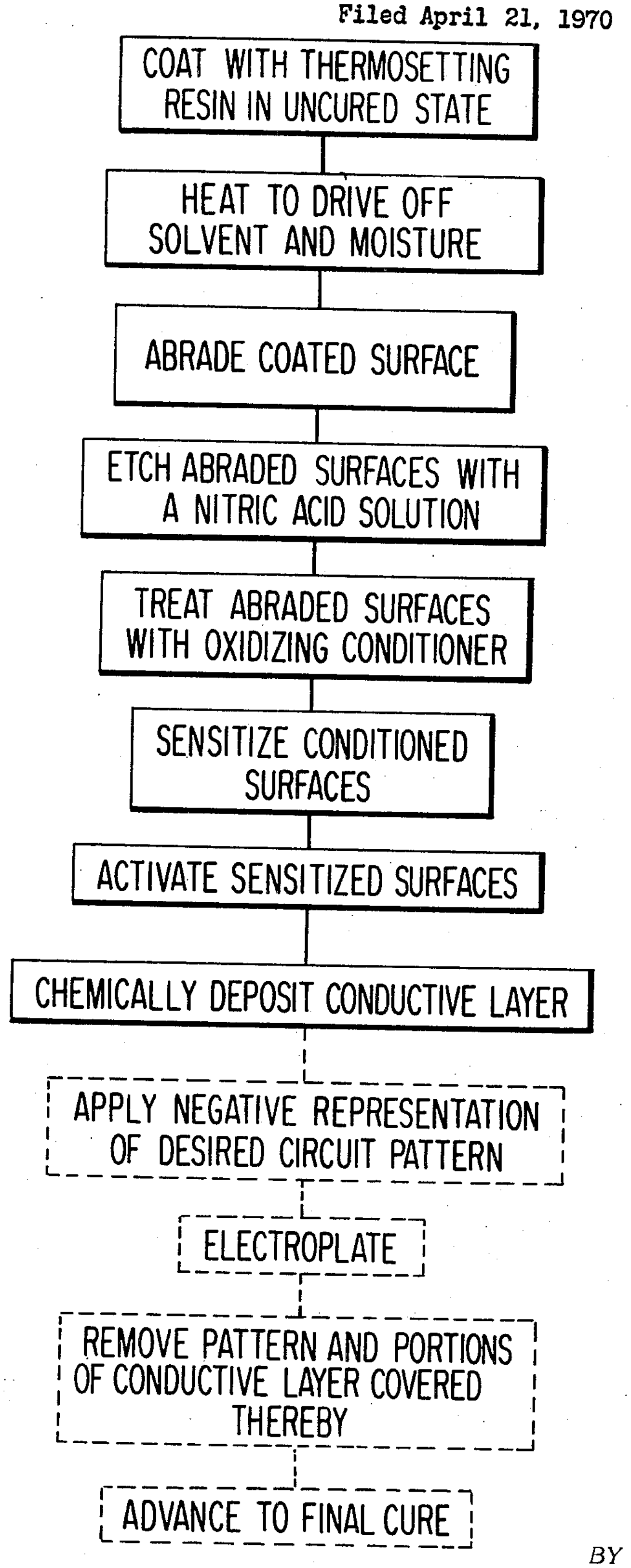
INVENTOR.
Robert R. Russo
BY [signature]
ATTORNEY United States Patent Office 3,704,208

Patented Nov. 28, 1972

3,704,208

PROCESS FOR FORMING A CONDUCTIVE COATING ON A SUBSTRATE

Robert Ritter Russo, Indianapolis, Ind., assignor to RCA Corporation

Filed Apr. 21, 1970, Ser. No. 30,554
Int. Cl. C23b 5/48, 5/60
U.S. Cl. 204—15 16 Claims

ABSTRACT OF THE DISCLOSURE

A substrate is modified by the application of a thermo-setting resinous mixture such that the modified substrate may be chemically treated in a specified manner including the use of a nitric acid solution to provide, for example, a printed circuit board.

This invention relates to techniques for promoting the adhesion of conductive materials to a substrate, and is particularly applicable to the manufacture of printed circuit boards.

The two techniques generally available for the fabrication of printed circuit boards are the subtractive or "etch-down" technique and the additive or "build-up" technique.

The majority of printed circuits presently in commercial use are fabricated using subtractive techniques. These techniques generally entail selectively etching away unwanted copper from a sheet of copper-clad dielectric material to arrive at the desired circuit pattern.

Additive techniques, wherein the circuitry is added to an unclad base substrate, have been less commonly used in the past. The desirability of manufacturing double sided boards incorporating plated through holes, however, has substantially increased the use of additive techniques.

One of the major problems associated with making printed circuits using additive techniques is to provide a strong bond between the base substrate and the added circuitry. The standard by which this is measured in the industry is referred to as peel strength. Peel strength is generally defined in terms of pounds per inch (p.p.i.) and is measured by peeling a one inch wide strip of the coating from the coated surface at an angle of 90° and a peel rate of 2 inches per minute. The Mil. Spec. P13949D specifies a peel strength of 8 pounds per inch for one ounce copper-clad laminates as a minimum standard for printed circuit patterns.

In the case of subtractive techniques, peel strength requirements have not presented any major difficulty primarily because the base substrate is supplied to the printed circuit fabricator with a uniform cladding of conductive metal which is generally laminated to the substrate using appropriate adhesives, heat, and pressure. After the undesired portions of the cladding are etched away, the unveiled circuitry remains tightly bonded to the base laminate, i.e. peel strengths are in the order of 8–12 p.p.i. In the case of additive techniques, however, the base substrate is not metal clad, and the resultant peel strength of the added circuitry from the base is solely a function of the deposition process and any pretreatment of the substrate that may be employed.

Accordingly, it is an object of the present invention to provide an improved method for promoting the adhesion of conductive materials to a substrate.

In the formation of conductive patterns on a substrate in accordance with the prior art, the sequence of steps generally followed includes sensitizing the surface of a non-conductive substrate with a reducing agent; activating the sensitized surface in a solution of a noble metal salt; chemically or "electrolessly" depositing a relatively thin layer of conductive material upon the activated surface, and electrolytically depositing the conductive pattern to a desired thickness. Experimentation has shown that the bonds formed between the electrolessly deposited material and the non-conducting surface are essentially physical in nature. Furthermore, where the non-conducting base material exhibits a substantially smooth surface, low peel strengths, e.g. less than one pound per inch, are not uncommon. Several methods have been used previously to improve this bond strength. These have included erosion techniques, such as chemical etching or physical abrasion to roughen the surface of the base material, or the use of adhesive layers between the non-conducting base material and the electrolessly deposited conductor. Such chemical methods have been successfully developed for plastics such as acrylonitrile-butadiene-styrene (ABS), polysulfone and polypropylene, whereby a surface is produced which provides good bonds with subsequently deposited metals. Chemical treatment of the other plastics, for example the phenolics and epoxies commonly used in printed circuit fabrication, does not produce a significant improvement in adhesion. Physical abrasion methods improve the adhesion slightly though not sufficiently to pass peel strength requirements for printed circuit applications.

Adhesive layers, on the other hand, have resulted in relatively good bond strengths and much work has been done towards their incorporation into printed circuit manufacture. To date, however, these adhesive techniques have proven to be difficult to control and have resulted in poor reproducibility.

To overcome these problems, attempts have been made to promote the adhesion of subsequently deposited conductors to adhesive layers by sprinkling particles thereupon and either plating directly upon the projecting surface area of the particle impregnated layer, or by removing the particles from the adhesive layer and plating upon the roughened surface area remaining. See for example U.S. Pats. 2,739,881; 2,768,923; and 3,391,455. Further attempts have been made to promote the adhesion of subsequently deposited conductors to adhesive layers by pretreatment of the adhesive layer; for example, the recognition that adhesion improves due to advancement of the adhesive layer from an uncured state to a partially cured state prior to conductor deposition. See for example, U.S. Pats. 2,680,699; 3,035,944; 3,052,957; and 3,267,007.

The present invention recognizes the desirability of modifying the surface of a substrate, not otherwise compatible with any of the forementioned techniques, such that the modified substrate may be chemically treated, in the specified manner, to provide printed circuit boards with improved peel strength characteristics.

In accordance with an embodiment of the present invention, a layer of a thermo-setting resinous mixture is applied in its uncured state to the surface of a material adapted to serve as a circuit substrate; the resinous portion of the mixture being selected to be adhesively compatible with said material. The mixture is then heated to drive off the solution solvent and any free moisture therein. The coated substrate is thereafter uniformly abraded and then exposed to a nitric acid solution. Next the substrate is exposed to a chemical conditioner which prepares it for the subsequent deposition of a thin layer of conductive material via conventional electroless deposition techniques.

The present invention will be described with more specificity with regard to the manufacture of a printed circuit board, and will be best understood upon reading the following description in conjunction with the flow diagram appearing in the drawing.

Turning now to a detailed description of a method for manufacturing printed circuit boards in accordance with the present invention, the base substrate upon which the circuit is to be formed is first cleaned, for example, by passing it through a cold water spray. The wet panel is then scrubbed on each side by rotating wet abrasive brushes coated with very fine aluminum oxide or the like. Thereafter, the panel is passed through a second cold water rinse and then dried with an air knife at a temperature of 140°±10° F. The substrate used may be any one of a number of commercially available printed circuit materials such as, for example, the phenolic, epoxy or polyester laminates.

After the panel has been cleaned and dried it is immersed into a thermo-setting resinous composition which is selected to be adhesively compatible with the cleaned substrate. The composition, which is in an uncured state when applied, may be a polyvinyl acetal modified phenolic resin such as a polyvinyl butyral phenolic mixture. In practice, the Pittsburgh Plate Glass Company's E–835 has been used.

Upon removal from the resinous composition, the coated panel is air dried for approximately 5 minutes and then heated in an oven maintained at a temperature of approximately 300°±15° F. for a period of 4–6 minutes to drive off the solvents and/or any free moisture. The panels are thereafter permitted to cool. The dry film thickness of the resinous coating should be in the order of .0004″±20%. It should be noted that although the thermo-setting resinous composition applied is selected to be adhesively compatible with the base substrate, it is not selected, nor is it necessary for it to be adhesively compatible with the subsequently deposited conductor layer; i.e. vis-a-vis the conductive layer to be subsequently deposited, it appears as a non-conductive substrate and not as an adhesive layer.

Next the panel is punched or drilled, depending on the composition of the substrate selected, in accordance with the desired through-hole configuration. Alternatively, the panel may be drilled or punched prior to coating.

Thereafter, the coated panel is passed through a cold water spray for 15–20 seconds and the coated surfaces uniformly abraded by rotating brushes which may also be coated with very fine aluminum oxide or the like. In actual practice, Scotch-Brite-Redi-Load No. 70–A brushes, made by the 3M Company, have been successfully used both for cleaning the uncoated panel (supra) and abrading the coated panel. The panel is then passed through a further cold water spray rinse.

After the coated panel has been surface abraded on both sides, it is passed through a spray etch machine charged with a nitric acid solution. The spray etcher may be of conventional design, i.e. titanium and PVC construction with controls and ventilating equipment. It should be equipped to hot spray rinse and hot air dry the panels thoroughly, immediately after etching. The etching solution is prepared, for example, by adding nitric and hydrochloric acids to deionized water to yield a nitric acid concentration of 10±1% by volume and a hydrochloric acid concentration of 5±1% by volume and is maintained at a total acidity of 2.3±.2 normal. The abraded panel is exposed to the nitric-hydrochloric etchant for approximately 2 minutes; the etchant being maintained at a temperature of 130°±3° F. After exposure to the etchant, the panels are rinsed in hot water (130°±5° F.) for about 30 seconds. Although the foredescribed solution has been used with good results, any aqueous solution having a nitric acid concentration of less than 20% by volume may be used effectively.

Thereafter, the abraded panels are prepared for the subsequent electroless plating deposition by treatment with a strong oxidizing conditioner. The conditioner may be of the chromic acid type, such as Enthone's Enplate 470. In its commercial form, the 470 conditioner has a $CR^{+6}$ ion activity of from .6–1.0 normal, with .8 normal as nominal. It has been found desirable to increase the activity of the commercially available 470 conditioner by the addition of an additive comprising a $CR^{+6}$ compound such as chromium trioxide ($CrO_3$) or a metal chromate to raise its activity between 2.4–3.2 normal. Stated another way, considering the commercially available 470 conditioner as having an activity level of 100% at nominal, it has been found desirable to raise its activity level to 350±50%. This may be accomplished by adding two ounces of Enthone's 470 additive per gallon of commercially available 470 conditioner for each 10% increase in activity desired. The conditioning solution should be maintained at a temperature of 113±3° F. and at a specific gravity of from 1.52–1.57. The concentration of sulfuric acid present should be maintained at 52±4% by volume, and the tri-valent chromium ion content should not be permitted to exceed 2 ounces per gallon.

Prior to conditioning the etched panels are rinsed in a tap water (75°±5° F.) spray for 15–60 seconds. The panels are then exposed to the activated conditioner for 20–40 seconds, depending on the activity level thereof, according to the following schedule.

| Activity: | Exposure time, sec. |
|---|---|
| 300–330 | 40 |
| 330–370 | 30 |
| 370–400 | 20 |

Immediately thereafter, i.e. within a period of approximately 20 seconds, the coated panel is thoroughly rinsed with and immersed in tap water (75°±50 F.), and then immersion rinsed in deinoized water.

Following the deinoized water rinse, the conditioned panels are immersed in a sensitizing reducing agent solution, such as stannous chloride ($SnCl_2$), for 60–180 seconds, with mild mechanical agitation. In practice, a solution formed by mixing one part of Enthone's Enplate sensitizer 432 to 15 parts of deionized water, by volume, is used. This is followed by immersion rinsing first in tap water (75°±5° F.) and then in deionized water.

After rinsing the sensitized panels are immersed in an activating solution of a noble metal salt, such as palladium chloride ($PdCl_2$), for 60–120 seconds, with mild mechanical agitation. In practice, a solution formed by mixing one part of Enthone's Enplate activator 440M to 15 parts of deionized water, by volume, is used. This is followed by immersion rinsing, first in tap water and then in deionized water.

Thereafter the activated panels are panel plated in an electroless copper bath, controlled at a temperature of 75°±5° F., for approximately 10 minutes. This immersion is accompanied by mild air plus mechanical agitation to provide approximately a .00001″ thick layer of electrolessly deposited copper on the activated surface. The electroless bath may be formed by mixing 3 parts by volume of Enthone's Enplate CU–402A, 3 parts Enplate CU–402B and 4 parts deionized water. The panel plated boards are then rinsed in tap water and forced air dried at a temperature of 140°±10° F. for 60–120 seconds.

Following the electroless deposition, the plated panels are imprinted on one side with a negative representation of the desired circuit configuration; i.e. the electrolessly deposited copper is left exposed in accordance with the desired circuit pattern. This negative representation may be applied by any one of a number of conventional techniques. In practice, it has been found desirable to use screen printing techniques and to form the pattern with a screen resist such as Dynachem 2004–70M. After screening the resist is permitted to air dry for a minimum of 3 minutes and then cured for a minimum of 60 seconds in an infra-red oven followed by 90 seconds in a forced hot air ventilated oven at 150°±10° F. Thereafter the panels are turned over and the foregoing step repeated.

Next the printed panels are acid cleaned for 15–20 seconds in a 10% solution of sulfuric acid at 70–75° F. and immersion rinsed in tap water. Thereafter the panels are immersed into the first of a three stage pyrophosphate electrolytic copper bath, maintained at a temperature of 130±2° F., for 2 minutes, at a current density of 2.5 amperes per sq. ft. The panels are agitated to force the plating solution through the holes. Next the panels are consecutively immersed into the second and third stages of the pyrophosphate bath for 15 and 55 minutes, at current densities of 13.5 and 30 amperes per sq. ft. respectively, each at a temperature of 130±2° F., with accompanying agitation. The electroplated panels are then rinsed in water and the rinsing step followed by hot air drying at a temperature of 160±5° F., for 3–4 minutes.

The pyrophosphate bath is operated at a chemical concentration as follows:

copper (as metal)—2.5 to 4.0 ounces per gallon with 3.0 ounces per gallon as nominal;
pyrophosphate—17.5 to 28.0 ounces per gallon with 21.0 ounces per gallon as nominal; and
ammonia ($NH_3$)—.20 to .40 ounce per gallon with .30 ounce per gallon as the nominal.

The ratio of pyrophosphate to the copper material is critical and should be maintained at a ratio of from 1:1 to 7.5:1 and at a pH of from 8.0 to 8.5. After exposure to the pyrophosphate bath, the thickness of the copper circuit configuration measures approximately .001"–.002".

Next the plated circuit boards are processed through a trichloroethylene spray followed by brush scrubbing and an air knife to remove the plating resist.

After the plating resist is removed, the boards are processed through an etching machine charged with ammonium persulphate for the purpose of removing the layer of electroless copper left exposed after the removal of the resist. From the etcher, the circuit boards are spray rinsed and dried by an air knife to leave them moisture free.

The cure of the resinous composition with which the board was initially coated is advanced by the various steps of the process. To optimize peel strength, however, it is essential that the resinous composition be fully cured and devoid of residual moisture. Final curing is insured by the subsequent application of heat. For example, where the board is subsequently coated with a solder resist and/or imprinted with a circuit schematic, such steps are accompanied by a drying step at a temperature sufficient to cure the resin. Alternately, final curing may be achieved by wave soldering after the circuit components have been mounted upon the board.

What is claimed is:

1. A process for forming a conductive coating on a substrate, comprising the steps of:
- (a) modifying the surface of said substrate by applying a solution or dispersion of an uncured thermosetting resinous mixture thereon, said mixture being adhesively compatible with said substrate and capable of absorbing an aqueous solution;
- (b) heating said modified substrate to drive off any solvent or moisture therein to solidify said mixture;
- (c) uniformly abrading said modified surface to expose the subsurface for subsequent soaking;
- (d) treating said uniformly abraded surface with a nitric acid solution to soak the subsurface portions of said surface;
- (e) further treating said surface with an oxidizing conditioner to react with the nitric acid solution to develop micro-openings in said surface;
- (f) sensitizing said conditioned surface with a reducing agent;
- (g) activating said sensitized surface with a solution of a noble metal salt;
- (h) chemically depositing the desired conductive coating upon said activated surface to the desired thickness; and
- (i) subsequently advancing said resinous composition to a fully cured state.

2. The invention in accordance with claim 1 wherein said nitric acid solution comprises an aqueous solution having a nitric acid concentration of less than 20% by volume.

3. The invention in accordance with claim 1 wherein said nitric acid solution comprises a nitric acid concentration of 10±1% by volume and a hydrochloric acid concentration of 5±1% by volume.

4. The invention in accordance with claim 1 wherein said thermo-setting resinous composition is a polyvinyl acetal modified phenolic resin.

5. The invention in accordance with claim 4 wherein said polyvinyl acetal modified phenolic resin is a polyvinyl butyral phenolic mixture.

6. The invention in accordance with claim 1 wherein said oxidizing conditioner comprises a chromic acid solution.

7. The invention in accordance with claim 6 wherein said chromic acid solution has a $CR^{+6}$ ion activity level of between 2.4 and 3.2 normal.

8. A process for forming a printed circuit pattern on a substrate, comprising the steps of:
- (a) modifying the surface of said substrate by applying continuously over at least one surface thereof a solution or dispersion of an uncured thermo-setting resinous mixture thereon, said mixture being adhesively compatible with said substrate and capable of absorbing an aqueous solution;
- (b) heating said modified substrate to drive off any solvent or moisture therein to solidify said mixture;
- (c) uniformly abrading said modified substrate surface to expose the subsurface for subsequent soaking;
- (d) treating said uniformly abraded surface with a nitric acid solution to soak the subsurface portions of said surface;
- (e) further treating said substrate surface with an oxidizing conditioner to react with the absorbed aqueous solution to develop micro-openings in said surface;
- (f) sensitizing said conditioned surface with a reducing agent;
- (g) activating said sensitized surface with a solution of a noble metal salt;
- (h) chemically depositing a relatively thin layer of conductive material upon said activated surface, said layer exhibiting sufficient electrical conductivity to permit subsequent electroplating thereto;
- (i) applying a negative representation of the desired circuit pattern upon said conductive layer;
- (j) electrolytically depositing metal on the portions of said layer of conductive material not covered by said applied pattern;
- (k) removing said applied pattern and those portions of said layer covered thereby; and
- (l) advancing said resinous composition to a fully cured state.

9. The invention in accordance with claim 8 wherein said nitric acid solution comprises an aqueous solution having a nitric acid concentration of less than 20% by volume.

10. The invention in accordance with claim 8 wherein said thermo-setting resinous composition is a polyvinyl acetal modified phenolic resin.

11. The invention in accordance with claim 10 wherein said polyvinyl acetal modified phenolic resin is a polyvinyl butyral phenolic mixture.

12. The invention in accordance with claim 8 wherein said oxidizing conditioner comprises a chromic acid solution.

13. The invention in accordance with claim 12 wherein said chromic acid solution has a $CR^{+6}$ ion activity level of between 2.4 and 3.2 normal.

14. The invention in accordance with claim 13 wherein said abraded substrate is treated with said chromic acid solution for a period of from 20 to 40 seconds, depending on the activity level of said $CR^{+6}$ ion.

15. A process for forming a printed circuit pattern on a substrate, comprising the steps of:

(a) modifying said substrate by applying continuously over at least one surface thereof a solution or dispersion of a polyvinyl butyral phenolic resin mixture in an uncured state;

(b) heating said modified substrate in an oven maintained at a temperature of approximately 300°±15° F. for a period of 4–6 minutes to drive off any solvents and any free moisture therein to solidify said mixture;

(c) uniformly abrading said modified substrate surface to expose the subsurface for subsequent soaking;

(d) treating said uniformly abraded surface with a nitric acid solution to soak the subsurface portions of said surface;

(e) further treating said surface with a chromic acid conditioner having a $CR^{+6}$ ion activity level of from 2.4 to 3.2 normal for a period of from 20 to 40 seconds to react with the absorbed aqueous solution to develop micro-openings in said surface;

(f) sensitizing said conditioned surface with a stannous chloride solution;

(g) activating said sensitized surface with a solution of palladium chloride;

(h) chemically depositing a relatively thin layer of conductive material upon said activated surface, said layer exhibiting sufficient electrical conductivity to permit subsequent electroplating thereto;

(i) applying a negative representation of the desired circuit pattern upon said conductive layer;

(j) electrolytically depositing metal on the portions of said layer of conductive material not covered by said applied pattern;

(k) removing said applied pattern and those portions of said layer covered thereby; and (l) advancing said phenolic mixture to a fully cured state.

16. The invention in accordance with claim 15 wherein said nitric acid solution comprises a nitric acid concentration of 10±1% by volume and a hydrochloric acid concentration of 5±1% by volume.

References Cited

UNITED STATES PATENTS

| | | | |
|---|---|---|---|
| 3,434,867 | 3/1969 | Rousselot | 117—47 |
| 3,052,957 | 9/1962 | Swanson | 204—15 |
| 3,267,007 | 8/1966 | Sloan | 204—15 |
| 3,514,538 | 5/1970 | Chadwick et al. | 204—15 |
| 3,560,241 | 2/1971 | Davis | 204—30 |
| 3,558,443 | 1/1971 | Khelghatian | 204—30 |

FOREIGN PATENTS

| | | | |
|---|---|---|---|
| 1,110,765 | 4/1968 | Great Britain | 204—30 |

JOHN H. MACK, Primary Examiner

T. TUFARIELLO, Assistant Examiner

U.S. Cl. X.R.

117—47 A; 204—30

UNITED STATES PATENT OFFICE

CERTIFICATE OF CORRECTION

Patent No. 3,704,208 Dated November 28, 1972

Inventor(s) Robert Ritter Russo

It is certified that error appears in the above-identified patent and that said Letters Patent are hereby corrected as shown below:

Column 4, line 27 change "50 F" to --5°F--; Column 5, line 20 change "1:1" to --7:1--.

Signed and sealed this 1st day of May 1973.

(SEAL)
Attest:

EDWARD M. FLETCHER, JR.
Attesting Officer

ROBERT GOTTSCHALK
Commissioner of Patents

FORM PO-1050 (10-69)
3530 6|72

USCOMM-DC 60376-P69
☆ U.S. GOVERNMENT PRINTING OFFICE : 1969 O—366-334

Disclaimer

3,704,208.—*Robert Ritter Russo*, Indianapolis, Ind. PROCESS FOR FORMING A CONDUCTIVE COATING ON A SUBSTRATE. Patent dated Nov. 28, 1972. Disclaimer filed Jan. 11, 1973, by the assignee, *RCA Corporation.*

Hereby disclaims the portion of the term of the patent subsequent to Aug. 8, 1989.

[*Official Gazette November 6, 1973.*]